(12) United States Patent
Daughton

(10) Patent No.: US 6,168,860 B1
(45) Date of Patent: Jan. 2, 2001

(54) MAGNETIC STRUCTURE WITH STRATIFIED LAYERS

(75) Inventor: James M. Daughton, Eden Prairie, MN (US)

(73) Assignee: Nonvolatile Electronics, Incorporated, Eden Prairie, MN (US)

(*) Notice: Under 35 U.S.C. 154(b), the term of this patent shall be extended for 0 days.

(21) Appl. No.: 08/679,183

(22) Filed: Jul. 12, 1996

Related U.S. Application Data

(63) Continuation of application No. 08/096,765, filed on Jul. 23, 1993, now abandoned.

(51) Int. Cl.[7] ............................................. G11B 3/66
(52) U.S. Cl. ..................... 428/332; 428/336; 428/694 T; 428/694 TS; 428/694 TM; 428/634 R; 428/632; 428/900; 360/113; 360/126; 324/252
(58) Field of Search ................... 478/634 T, 694 TS, 478/694 TM, 692, 694 R, 300, 352, 336; 360/113, 126; 324/252

(56) References Cited

U.S. PATENT DOCUMENTS

| 4,663,607 | 5/1987 | Kitada et al. | 338/32 |
| 5,157,570 | * 10/1992 | Shukowsky | 300/120 |
| 5,159,513 | * 10/1992 | Dieny | 360/101 |
| 5,206,590 | * 4/1993 | Dieny | 324/252 |
| 5,549,978 | * 8/1996 | Iwasaki | 428/692 |
| 5,595,830 | * 1/1997 | Daughton | 428/611 |

FOREIGN PATENT DOCUMENTS

| 1438563 | 4/1979 | (FR) . |

OTHER PUBLICATIONS

Magnetic and Magnetoresistive Properties of Multilayered Permalloy Thin Films , *Thin Solid Films*, vol. 158, No. 2, Apr. 1988, pp. 167–174.

Preparation of (Fe/Fe–N)/(Si–O) and A (EE/FE–N)/(Si–N) Multilayered Films by sputtering, ECR Plasma Nitridation and ECR Plasma CVD , *Japanese Journal of Applied Physics*, vol. 31, No. 4, pp. 1045–1049, 1992.

Dead Anistropy Layer in Permalloy Film Composed of Two Induced Anisitropy Layers , *IEEE Translation Journal on Magnetics in Japan*, vol. 3, No. 7, Jul. 1, 1988, pp. 575–576.

Excerpt entitled "Nonmagnetostrictive Compositions of Fe–Ni–Co Films" by C.H. Tolman, from *Journal of Applied Physics*, vol. 38, p. 3409–3410, 1967.

P. 165 from book entitled *Ferromagnetism* by Richard M. Bozorth, published by D. Van Nostrand Company, Inc., Princeton, New Jersey, Copyright 1978.

* cited by examiner

Primary Examiner—Leszek Kiliman
(74) Attorney, Agent, or Firm—Kinney & Lange, P.A.

(57) ABSTRACT

A composite film on a substrate having a first magnetostrictive, magnetoresistive, anisotropic ferromagnetic thin-film provided on that substrate with a second ferromagnetic thin-film provided immediately thereon which is also magnetorestrictive, magnetoresistive, anisotropic, with a composition differing from the first ferromagnetic thin-film. Various parameters of said first and second ferromagnetic thin-films are selected to provide such a composite film with little or no magnetostriction. Such composite films can be used in various devices.

26 Claims, 4 Drawing Sheets

MAGNETIC STRUCTURE WITH STRATIFIED LAYERS

This is a continuation of application Ser. No. 08/096,765, filed Jul. 23, 1993 now abandoned.

This invention is made with Government support under Grant ISI-9102344 provided by the National Science Foundation. The Government has certain rights in the invention.

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This is considerably enhanced by choosing the separating material in the ferromagnetic thin-film memory cells to each be sufficiently thin. Similar "sandwich" structures are also used in magnetic sensing structures.

In the recent past, reducing the thicknesses of the ferromagnetic thin-films and the intermediate layers in extended "sandwich" structures having additional alternating ones of such films and layers, i.e. superlattices, have been shown to lead to a "giant magnetoresistive effect" being present. This effect yields a magnetoresistive response which can be in the range of up to an order of magnitude greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion which comes about because of an anisotropy therein typically resulting from depositing the film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, the giant magnetoresistive effect can be increased by adding further alternate intermediate and ferromagnetic thin-film layers to extend a "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These results come about because of magnetic exchange coupling between the ferromagnetic thin-films separated by the intermediate layers, these intermediate layers typically formed from a nonferromagnetic transition metal. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one anther) and antiferromagnetic coupling (such that the magnetizations of the separated layers are opposed to one another, or antiparallel to one another). Thus, for some separation thicknesses, the layer coupling will be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A broader understanding of the giant magnetoresistance effect, i.e. the spin valve effect, can be obtained by considering a generalized multilayer structure shown in FIG. 1 and ignoring, for simplicity though this is not necessary, the ordinary anisotropic magnetoresistive effect. The structure is typically provided on a semiconductor chip, 10, having suitable operating circuitry therein. An electrical insulating layer, 11, supports N identical ferromagnetic thin-film conductive layers, each separated from an adjacent one by one of N−1 identical nonmagnetic, conductive intermediate layers to form a superlattice structure. A highly resistive outer passivation layer, 13, covers this structure, and suitable electrical interconnections are made to the conductive layers but not shown. The conductance of this superlattice structure will be the sum of the conductances of the individual layers which are effectively electrically in parallel with one another, but the giant magnetoresistive effect introduces magnetization dependence in the ferromagnetic thin-films. In the following, a possible model is developed to an extent as a basis for gaining a better understanding of the electrical and magnetic behavior of this structure, but this model is simplified by approximations and not all would agree with every aspect of the approach chosen.

The conductance of very thin-films is highly dependent on surface scattering if the mean-free path of conduction electrons in the bulk material of the films is equal to or longer than the thickness of the films. The ratio of the film conductivity to the conductivity of the film material in bulk can be expressed as a function of the ratio of the film thickness to the mean-free path of electrons in bulk material identical to the film material by the well known Fuchs-Sondheim conduction model assuming inelastic scattering at the film surfaces, or by other associated models taking further conditions into account such as grain boundary scattering and other surface scatterings.

The magnetization dependence in the ferromagnetic thin-films leading to the giant magnetoresistive effect appears dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P=2f-1$. Such electrons are assumed in encounters with atomically perfect boundaries between the magnetic layers, including in this boundary the thin nonmagnetic, conductive intermediate layer therebetween, to be either scattered inelastically or pass freely into the next magnetic layer.

In view of the observed spin polarization, the simplifying assumption is made that the probability of a spin up electron not being scattered in entering a material having a majority of spin up electrons is approximately equal to the fraction of the electrons in the conduction band which are spin up, and that the probability of a spin down electron going into the same material not being scattered is equal to the fraction of the electrons in the conduction band which are spin down. Changing the magnetization directions between parallel and antiparallel in adjacent ferromagnetic thin-films changes the conduction band electrons in the films from having matching spin up and spin down fractions in each to having opposite spin up and spin down fractions in each. Thus, a larger fraction of the electrons in the superlattice structure will be scattered when the magnetizations in the ferromagnetic thin-films are antiparallel as compared to when they are parallel, since more than half of the electrons in the conduction band are spin up in view of the spin up fraction values given above. If the ferromagnetic thin-films are separated by a conductor layer which preserves the spin of the conduction electrons in passing therethrough, some conduction electrons can pass from one layer to the other without collisions and so can travel through effectively a thicker layer than those which are scattered to thereby be confined within a single layer. As a result, the scattered electrons can have a significantly lower conductivity and so, if the ferromagnetic films are oppositely magnetized, there will be a greater effective resistance in the structure. This view of the conduction electron transport between ferromagnetic thin-film layers can be adjusted for imperfections at the boundaries between adjacent ferromagnetic thin-films for conduction band electrons, which would not be scattered because of the spin thereof, may instead be scattered by physical imperfections at the boundary.

Based on the foregoing, the effective conductivities for parallel and antiparallel magnetization states in the superlattice structure can be determined, and subtracted from one another to provide the ratio of change in effective conductivities of the ferromagnetic thin-films, due to a corresponding change between parallel and antiparallel magnetizations in those films, to the average conductivity in those films. The result of this determination must have added to it the conductivities of the nonmagnetic, conductive intermediate layers on the basis of those layers having equal populations of spin up and spin down conduction band electrons, and a conductivity which does not change with magnetization directions. In such a setting, the ratio of the difference in sheet conductances of the superlattice structure when the ferromagnetic thin-films change magnetization from parallel to antiparallel, $\Delta\gamma_{\perp\to\parallel}$, to the average of these sheet conductances, $\overline{\gamma}_{\perp\to\parallel}$, be obtained as $$\frac{\Delta\gamma_{\perp\to\parallel}}{\overline{\gamma}_{\perp\to\parallel}} = \frac{NqP^2(\gamma_{mM} - \gamma_{ml})}{\frac{N}{2}[q\gamma_{mN} + (2-q)\gamma_{ml}] + (N-1)q\gamma_{cl}},$$

ignoring the ordinary anisotropic magnetoresistance in obtaining this giant magnetoresistive response as indicated above. Here q represents physical boundary imperfections, and is the probability that a conduction electron which would not be scattered because of its spin is also not scattered by physical imperfections or collisions in the nonmagnetic, conductive intermediate layers.

The symbol $\gamma_{ml}$ is the sheet conductance in a single ferromagnetic thin-film, the sheet conductance per unit square of a thin-film being the conductivity thereof multiplied by the thickness thereof. Thus, $N\gamma_{ml}$ is the sheet conductance of N parallel ferromagnetic thin-films. The symbol $\gamma_{mN}$ is the sheet conductance of a layer of ferromagnetic thin-film N times the thickness of a single ferromagnetic thin-film, and $\gamma_{cl}$ is the sheet conductance of a nonmagnetic, conductive intermediate layer.

The number N of ferromagnetic thin-films affects the differences in sheet conductances because of the difference in conductivity between a ferromagnetic thin-film which is N layers thick compared to N ferromagnetic thin-films electrically connected in parallel. The polarization factor P is, as indicated above, expected to be important in the giant magnetoresistive response in representing the fraction of spin up conduction band electrons, and this expectation is borne out by the square of that factor appearing in the numerator of the equation above.

The quality of the interface between the ferromagnetic thin-films and the nonmagnetic, conductive intermediate layers is important as represented in the last equation by the symbol q. The largest giant magnetoresistive effect values have been obtained in material systems where both the lattice constant and the crystal and the form in the crystal class of each interface material have been well matched. For example, chromium matches the body-centered cubic structure of iron better than all other natural body-centered cubic nonmagnetic metals. Copper is similarly the best match for face-centered cubic cobalt and for face-centered permalloy mixtures which are quite similar to nickel. Significant mismatches will likely give a very low value for q.

Also, scattering in the nonmagnetic, conductive intermediate layers is likely if the thickness of those layers is smaller than the mean-free path of conduction electrons in the bulk film material. Hence, the symbol q will be reduced in value for thicker intermediate films.

The film thickness also has a significant effect on the ratio of $\gamma_{mN}/\gamma_{ml}$ with this ratio increasing as the films get thinner, as shown by the Fuchs-Sondheim conduction model. The greatest conductivity difference between parallel and antiparallel magnetizations in the ferromagnetic thin-films can be seen, from the last expression above, to occur in the very thinnest of magnetic layers were it not for the scattering and shunting effects of the nonmagnetic, conductive intermediate layers. However, once the conductance of the magnetic layers, decreasing in being made thinner, gets to be on the order of the conductance of the nonmagnetic, conductive layers, the expression above shows that further decreases in thickness will reduce the giant magnetoresistive effect. Thus, for a fixed set of parameters for the nonmagnetic, conductive intermediate layer, the giant magnetoresistive effect will have a peak in value at some ferromagnetic thin-film thickness.

This assumes that the coupling between the structure ferromagnetic thin-films is also arranged to result in an operable device since it determines the range of magnetization angles which can be achieved in a device for given values of applied magnetic fields, so sets limits on the magnetoresistive response. If positive, or ferromagnetic, coupling is present and too great, the film magnetizations will not be sufficiently close to being antiparallel, and perhaps cannot be made so by passing a sensing current through the structure, so that the maximum resistance expected for the configuration cannot be obtained. On the other hand, if negative, or antiferromagnetic, coupling is present and too great, the film magnetizations will not be sufficiently close to being parallel, and perhaps cannot be made so by applying an external magnetic field to the structure, so that the minimum resistance expected for the configuration cannot be obtained.

Further, there is a limit on the thinness of the nonmagnetic, conductive intermediate layer because of "pin holes" occurring therethrough which result in that layer covering less than 100% of the surfaces of the ferromagnetic thin-films on either side thereof. These "pin holes" in the nonmagnetic, conductive intermediate layers are thought to lead to a current density dependence in the giant magnetoresistive effect which is not reflected in the last expression above. Such pin holes in this intermediate layer appear to result in ferromagnetic coupling between the ferromagnetic thin-films on either side of that layer in the vicinity of such holes thereby creating ferromagnetically coupled magnetic domains in these ferromagnetic thin-films which are otherwise antiferromagnetically coupled (assuming no external magnetic fields being applied).

As a result, there appears to be an incomplete saturation of magnetizations across the superlattice along the easy axes so that higher currents through the superlattice structure generate a "scissoring" magnetic field (a field forcing magnetizations in films adjacent an intermediate layer in opposite directions) which counteracts the effects of the pin holes by forcing the magnetizations in the pin hole domains to more closely align with the magnetizations in the rest of the ferromagnetic thin-film in which they occur. Sufficiently high currents can leave a single domain in each such ferromagnetic thin-film.

A similar, but alternative, structure can be made by reducing the number of ferromagnetic layers in the structure of FIG. 1 to just two with a single intermediate layer therebetween, where this intermediate layer is formed of an electrically insulative material. If that intermediate layer is sufficient thin (20–50 Å), a tunnel diode will result in which current therethrough is dependent upon the magnetization states in the two ferromagnetic layers at opposite sides of the insulative layer. That is, such a magnetic tunnel diode will have tunneling current therethrough that will be a function of the relative magnetization states in these two layers, and which will also depend on the thickness of the intermediate insulating layer, kinds of magnetic materials in the ferromagnetic thin-film layers, the temperature and the applied voltage. The effective impedance of the magnetic tunnel diode measured between the two ferromagnetic thin-film layers with the insulating layer therebetween will be relatively high, certainly much higher than encountered in giant magnetoresistive effect structures where current direction is primarily parallel to the major surfaces of the films in those structures rather than perpendicular thereto as in tunnel diode structures.

The current flowing through such a magnetic tunnel diode will be primarily tunneling current at low applied voltage, but will follow more typical junction diode current patterns at higher applied voltages common to thermal flow. If the applied voltage is kept relatively small, the resulting tunneling current can be shown to have a magnitude which depends on the magnetization states of the two ferromagnetic thin-film layers on opposite sides of the electrically insulative layer. The ratio of the change in current flows between the situation of having the magnetizations in the two ferromagnetic thin-films pointing in the same direction versus pointing in the opposite direction, to the average current flow has been found to be the function of the polarizations of the conduction electrons in the two ferromagnetic thin-film layers on either side of the insulative layer. The change in current flow for a change between the two magnetic states can be reasonably approximated as being about twice the product of the polarizations of the conduction electrons in the two ferromagnetic thin-films.

A small signal conductance in such a magnetic tunneling device can be represented from a relatively simple model as $$G = G_0(1 + P_1 P_2 \cos \theta)$$

Here, $\theta$ is the angle between the directions of the magnetizations in the two ferromagnetic thin-films on either side of the insulative layer, and $P_1$ and $P_2$ are the polarizations of the conduction electrons in those two films. Thus, the conductivity G through the magnetic tunnel diode across the electrically insulated layer is the maximum when the ferromagnetic thin-film magnetizations point in the same direction, and a minimum when they point in opposite directions.

As indicated in the foregoing, both giant magnetoresistive response devices and magnetic tunnel diode devices have performances which depend strongly on the polarization of the conduction electrons in the ferromagnetic thin-film layers therein. Since it is the polarization of the conduction electrons in the ferromagnetic thin-film materials adjacent the intermediate layers between pairs of such ferromagnetic thin-films that is important, there is a strong desire to have the ferromagnetic materials immediately adjacent these intermediate layers have relatively high conduction electron polarizations. Since, as a general matter, the polarization of the material conduction electrons and the magnetic moment thereof each tend to increase when the other does, a higher magnetization moment material in the ferromagnetic thin-films immediately adjacent the non-magnetic intermediate layer, whether conductive or insulative, will give larger giant magnetoresistive responses in giant magnetoresistive response devices, and larger changes in electrical conduction in magnetic tunnel diode devices.

Thus, having a ferromagnetic material with a relatively large magnetic moment in the ferromagnetic thin-films immediately adjacent the intermediate layer in will typically result in better responses in such devices. On the other hand, increases in polarization in films usually means increases in magnetic hardness also. Rotating the film magnetization through the application of external magnetic fields to the film to thereby change the direction of such magnetization in the plane of the film will be more difficult in magnetic materials which are magnetically hard thus requiring larger applied fields for such directional changes. Hence, the use of high magnetic moment materials in the ferromagnetic thin-films on either side of the intermediate layer will make switching the magnetization directions therein significantly more difficult.

As a result, there can be substantial advantages in providing composite ferromagnetic thin-films which have two strata with the stratum nearest the intermediate layer having a higher magnetic moment and being a harder magnetic material, but with the second and usually thicker stratum on the opposite side of the first stratum from the intermediate layer being a softer magnetic material. The properties of the resulting composite layer are typically something like an average of the properties of the constituent layers so that in combination the magnetization can be rotated in that composite layer relatively easily, i.e. with smaller magnetic fields. Such an arrangement is described in a co-pending application by J. M. Daughton entitled "Magnetoresistive Structure with Alloy Layer" having Ser. No. 07/976,905 now abandoned which is assigned to the same assignee as the present application, and which is hereby incorporated herein by reference and made a part hereof.

Such a composite layer can be shown to have a resulting magnetization therefor which behaves like that of a single ferromagnetic layer so as to appear to have a single magnetization to rotate even if, for some reason, the easy axes of the two strata differ from one another. Consider first a single ferromagnetic thin-film having an easy axis therein typically set by applying a magnetic field in the direction desired for the easy axis during the deposition of the film. If the film after completion is subjected to a magnetic field having a portion parallel to the plane of the film, the free energy per unit of surface area of the film is typically represented as $$E_1 = T_1 K_1 \sin^2\theta - T_1 M_{s_1} H_f \cos(\theta - \xi).$$

Here, $E_1$ is the free energy per unit surface area of film 1 because of the induced anisotropy in the ferromagnetic thin-film resulting from the application of a magnetic field during its deposition, $T_1$ is the film thickness, $K_1$ is the film anisotropy constant, $M_{s_1}$ is the saturation magnetization of the film, and $H_f$ is the applied magnetic field in the plane of the film. The angle $\xi$ represents the angle between the easy axis of the film and the direction of the applied magnetic field in that film, and $\theta$ represents the angle between the easy axis of the film and the film magnetization direction.

This angle $\theta$ is always determined by the point where the free energy in the film is minimized, or where the torques due to (a) the torque exerted on the saturation magnetization by the film anisotropy, and (b) the torque on the saturation magnetization exerted by the applied field, balance. The torque can be written as $$\frac{dE_1}{d\theta} = 2T_1 K_1 \sin\theta\cos\theta - T_1 M_{s_1} H_f \sin(\theta - \xi)$$

This torque can be more clearly characterized as being the result of two fields if the so-called anisotropy field, $H_{K_1}$, is introduced therein, the anisotropy field being defined as $H_{K_1} = 2K_1/M_{s_1}$, to give $$\frac{dE_1}{d\theta} = \frac{T_1 M_{s_1} H_{K_1}}{2} \sin 2\theta - T_1 M_{s_1} H_f \sin(\xi - \theta)$$

where a trigonometric identity has been used. Thus, the factors of a magnetic field value multiplying the saturation magnetization appear in each term thereby showing a certain similarity between them.

In a composite layer formed of two ferromagnetic thin-films or strata in immediate contact with one another, the free energies in each will be additive in forming the free energy for the composite. However, because of the strong exchange coupling in such circumstances, the magnetizations in the two films will be tightly bound to each other so as to be constrained to effectively be aligned with one another, that is, to each be oriented in the same direction as the other. Further, there is the possibility that the easy axis in each of the two films will not be aligned in a common direction such as if each film was deposited in a corresponding magnetic field that differed in direction from that in which the other was deposited. In these circumstances, taking the easy axis of the first film as the zero angle reference, the total free energy per unit surface area of the two films, E, in the presence of an applied magnetic field $H_f$ present in the plane of each film will be $$E = E_1 + E_2 = T_1 K_1 \sin^2\theta - T_1 M_{s_1} H_f \cos(\theta-\xi) + T_2 K_2 \sin^2(\theta-\gamma) - T_2 M_{s_2} H_f \cos(\theta-\xi)$$

where $E_1$ and $E_2$ are the additive surface free energies of each of the strata. Each parameter has a numerical subscript which indicates the one of the two strata which it is characterizing but the parameters otherwise retain the meanings they had above for a single film. The angle $\gamma$ is the angle between the directions of the easy axes in each film, i.e. the skew between the directions of those axes.

Again finding the torque, the derivative with respect to $\theta$ is taken to yield $$\frac{dE}{d\theta} = (T_1 K_1 + T_2 K_2 \cos 2\gamma)\sin 2\theta - T_2 K_2 \sin 2\gamma \cos 2\theta +$$
$$(T_1 M_{s_1} + T_2 M_{s_2}) H \cos\xi \sin\theta - (T_1 M_{s_1} + T_2 M_{s_2}) H \sin\xi \cos\theta$$

using some trigonometric identities. Further manipulation of this equation, along with introducing the effective anisotropy fields $H_{K_1}$ and $H_{K_2}$ defined for each layer in the manner given above for layer 1, permits changing it into the form $$\frac{dE}{d\theta} = \sqrt{\left(\frac{H_{K_1} M_{s_1} T_1}{2}\right)^2 + \frac{2 H_{K_1} H_{K_2} M_{s_1} M_{s_2} T_1 T_2 \cos 2\gamma}{4} + \left(\frac{H_{K_2} M_{s_1} T_2}{2}\right)^2} \sin 2\theta -$$
$$(T_1 M_{s_1} + T_2 M_{s_2}) H \sin(\theta - \xi).$$

Comparing this last result with the torque result for a single film shows the composite film behaves like a single film which has a joint effective anisotropy field that is the sum of the effective anisotropy fields in each layer plus a term depending on the skew between the easy axes in each.

In the absence of any skew between the easy axes of the two strata of the composite film, the combined torque becomes $$\frac{dE}{d\theta} = \frac{H_{K_1} M_{s_1} T_1 + H_{K_2} M_{s_2} T_2}{2} \sin 2\theta -$$
$$(T_1 M_{s_1} + T_2 M_{s_2}) H_f \sin(\theta - \xi).$$

This is the usual situation since each of the strata in the composite film will normally be deposited in the presence of the same magnetic field. In this circumstance, one can easily see that there is a joint effective anisotropy field $H_{K\text{-}eff}$ conveniently definable as $$H_{K\text{-}eff} \triangleq \frac{H_{K_1} M_{s_1} T_1 + H_{K_2} M_{s_2} T_2}{M_{s_1} T_1 + M_{s_2} T_2}$$

which allows rewriting the last expression as $$\frac{dE}{d\theta} = \frac{H_{K\text{-}eff}(M_{s_1} T_1 + M_{s_2} T_2)}{2} \sin 2\theta -$$
$$(T_1 M_{s_1} + T_2 M_{s_2}) H \sin(\theta - \xi).$$

Comparing this last equation with the equation for the torque in a single film given above shows even more clearly how closely a composite film matches the behavior of a single film.

Thus, although composite films behave much like those individual films in the structure thereof with a composite effective anisotropy field, the effects of any magnetostrictive properties of the constituent films have been omitted. Such an omission is satisfactory if each of the constituent films has a composition which gives a resulting film exhibiting essentially zero magnetostriction. Formation of ferromagnetic thin-films with little or no magnetostrictive behavior has been used to form composite films for giant magnetoresistive response devices as has been disclosed in the patent application incorporated above having Ser. No. 07/976,905 now abandoned. FIG. 2 shows an ternary alloy system composition diagram for an iron, nickel and cobalt thin-film system having a non-magnetostrictive composition line plotted thereon. Compositions to the left of this line exhibit positive magnetostriction and compositions to the right exhibit negative magnetostriction.

However, the film compositions which lead to little or no magnetostrictive behavior in the resulting film are not necessarily those which lead to ferromagnetic thin-films having the greatest polarization of the conduction of electrons therein as is desired for improved performance of giant magnetoresistive response devices and magnetic tunnel diode devices, as indicated above. This is suggested in the ternary alloy composition diagram of FIG. 3 for the same metals system which has contours of selected equal saturation magnetization values, closely related to magnetic moments, plotted thereon. One easily sees that the largest values in this figure occur for compositions differing substantially from those on which the non-magnetostriction line falls in FIG. 2. Thus, there is a desire for fabricating such devices using composite ferromagnetic thin-films which are not constrained to be formed of only constituent films exhibiting zero or near zero magnetostrictive behavior.

SUMMARY OF THE INVENTION

The present invention provides a composite film on a substrate having a first magnetostrictive, magnetoresistive, anisotropic ferromagnetic thin-film provided on that substrate with a second ferromagnetic thin-film provided immediately thereon which is also magnetorestrictive, magnetoresistive, anisotropic, with a composition differing from the first ferromagnetic thin-film. Various parameters of said first and second ferromagnetic thin-films are selected to provide such a composite film with little or no magnetostriction. Such composite films can be used in various devices such as giant magnetoresistive response devices and magnetic tunnel diode devices.

DETAILED DESCRIPTION OF THE PREFERRED EMBODIMENTS

Figure 3:
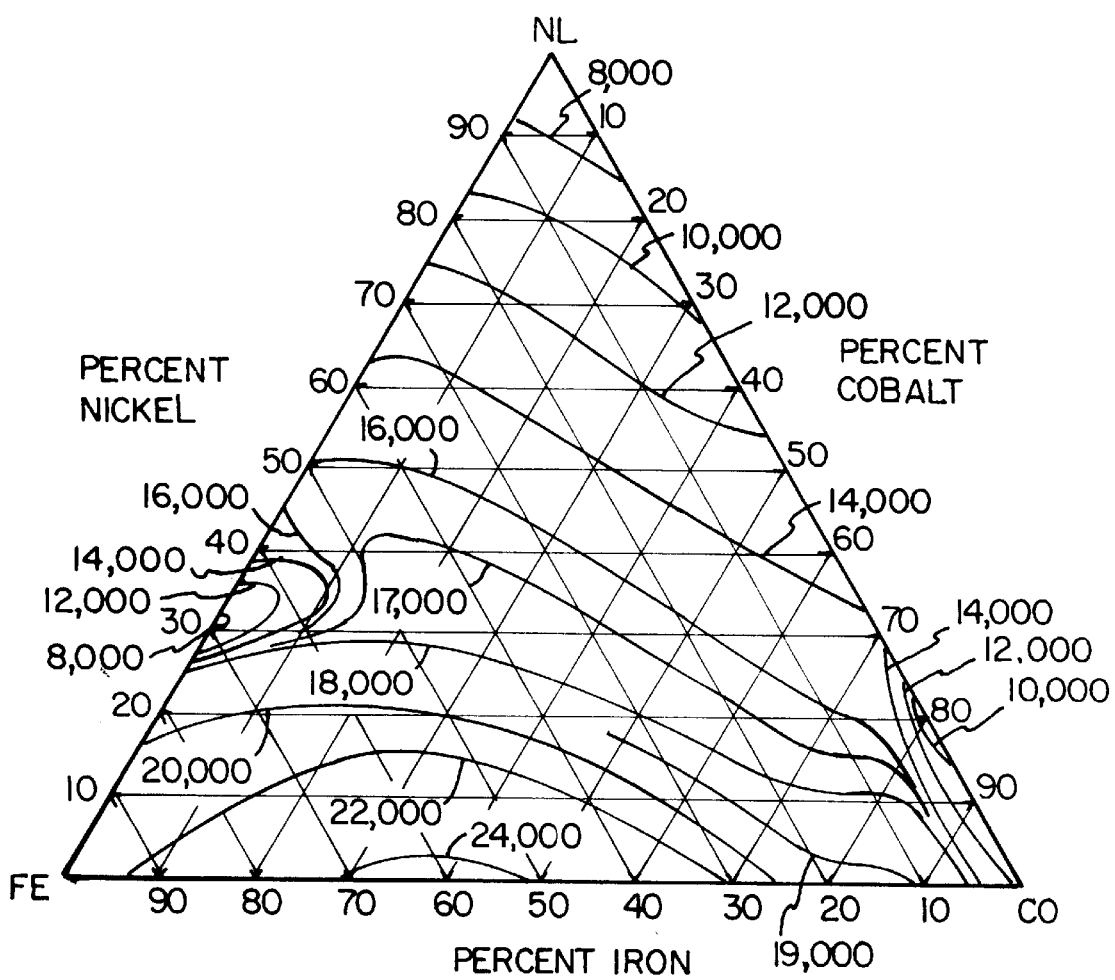
FIG. 3 is a composition diagram showing values of another parameter for selected compositions.

As can be seen in FIG. 3, compositions with magnetic saturations, or magnetic moments, that are on the high end of the possible values therefor in the metals system characterized there, occur for compositions which are substantially different than those having zero magnetostriction characteristics. Thus, the use of strata of different magnetic properties to form composite layers in a lattice structure, or "sandwich structure," adjacent to, and on either side of, electrically conductive or insulative, but non-magnetic, intermediate layers is an attractive possibility for obtaining large electron polarizations in the strata immediately adjacent such intermediate layers by forming those strata of such high magnetic moment compositions. On the other hand, the use of such strata will not only make switching of the magnetization orientation therein through the application of external magnetic fields more difficult, there will also be substantial magnetostrictive characteristics introduced in such strata. Hence, the remaining strata in such composite layers adjacent the sides of the first strata provided adjacent the opposite sides of the intermediate layers must be chosen to not only be soft magnetic materials to improve the switchability of the magnetizations of the composite layers in which they are provided, but also must be chosen to accommodate the magnetostrictive characteristics of the hard magnetic material strata.

The behavior of a composite layer having strata with magnetostrictive characteristics results in an addition to the magnetic free energy of that layer in the presence of stress being applied thereto in some manner to result in a strain therein. Hence, the total magnetic surface energy per unit area for the two strata in a composite layer is more accurately characterized by the expression $$E = E_1 + E_2 = T_1 K_1 \sin(\theta)^2 + T_2 K_2 \sin(\theta-\gamma)^2 - T_1 M_{s_1} H_f \cos(\theta-\xi) - T_2 M_{s_2} H_f \cos(\theta-\xi) - a_1 T_1 \lambda_{1\sigma1} \cos(\theta-\zeta)^2 + a_2 T_2 \lambda_2 \sigma_2 \cos(\theta-\zeta)^2$$

in which two terms have added to the last expression for surface free energy given above for a two-strata layer due to the presence of magnetostriction and stress. The two terms added are suggested by similar terms used in characterizing bulk material as is well known. The parameters used here that were previously used in the two-strata free energy expression above retain the same meaning here that they had above. The added terms present due to the magnetostrictive properties of the two strata in the composite layer each have a product of the applied stress, $\sigma_1$ and $\sigma_2$, respectively, multiplying the magnetostrictive constant for the corresponding layers, $\lambda_1$ and $\lambda_2$. The angle $\zeta$ is that occurring between the easy axis and the effective direction of the applied stress resulting from mismatches at temperature between a strata and its support, and between that strata what it in turn supports, in the structure in which it is provided. The numerical constants, $a_1$ and $a_2$ are proportionality constants for the magnetostrictive energy term, and in bulk material the values for isotropic magnetostriction for these terms are typically 3/2.

As before, the torque about the magnetization can be found by taking the derivative of this surface free energy with respect to $\theta$ which yields $$\frac{dE}{d\theta} = [(T_1 K_1 + T_2 K_2 \cos(2\gamma)) + (a_1 T_1 \lambda_1 \sigma_1 + a_2 T_2 \lambda_2 \sigma_2)\cos(2\zeta)]\sin(2\theta) - [T_2 K_2 \sin(2\gamma) + (a_1 T_1 \lambda_1 \sigma_1 + a_2 T_2 \lambda_2 \sigma_2)\sin(2\zeta)]\cos(2\theta) + (T_1 M_{s_1} + T_2 M_{s_2})H_f \cos(\xi)\sin(\theta) - (T_1 M_{s_1} + T_2 M_{s_2})H_f \sin(\xi)\cos(\theta)$$

after the use of identities and the grouping of terms. This result can be simplified to $$\frac{dE}{d\theta} = R_{2\theta} \sin[2(\theta - \beta)] - (T_1 M_{s_1} + T_2 M_{s_2})H_f \sin(\theta - \xi)$$

with the definitions $$R_\theta = \sqrt{(T_1 M_{s_1} + T_2 M_{s_2})^2 H_f^2 (\cos(\xi)^2 + \sin(\xi)^2)}$$
$$= (T_1 M_{s_1} + T_2 M_{s_2}) H_f$$

$$\sin(\alpha) = \frac{(T_1 M_{s_1} + T_2 M_{s_2}) H_f \sin(\xi)}{R_\theta}$$

$$\cos(\alpha) = \frac{(T_1 M_{s_1} + T_2 M_{s_2}) H_f \cos(\xi)}{R_\theta}$$

$$R_{2\theta} = \{[T_1 K_1 + T_2 K_2 \cos(2\gamma)]^2 + 2[T_1 K_1 + T_2 K_2 \cos(2\gamma)](a_1 T_1 \lambda_1 \sigma_1 + a_2 T_2 \lambda_2 \sigma_2)\cos(2\zeta) + [T_2 K_2 \sin(2\gamma)]^2 + 2 T_2 K_2 \sin(2\gamma)(a_1 T_1 \lambda_1 \sigma_1 + a_2 T_2 \lambda_2 \sigma_2)\sin(2\zeta) + (a_1 T_1 \lambda_1 \sigma_1 + a_2 T_2 \lambda_2 \sigma_2)^2\}^{\frac{1}{2}}$$

$$\sin(2\beta) = \frac{T_2 K_2 \sin(2\gamma) + (a_1 T_1 \lambda_1 \sigma_1 + a_2 T_2 \lambda_2 \sigma_2)\sin(2\zeta)}{R_{2\theta}}$$

$$\cos(2\beta) = \frac{(T_1 K_1 + T_2 K_2 \cos(2\gamma)) + (a_1 T_1 \lambda_1 \sigma_1 + a_2 T_2 \lambda_2 \sigma_2)\cos(2\zeta)}{R_{2\theta}}$$

Comparison of this result with that found above for the composite layer formed of two strata in the absence of magnetostriction, suggests the effective anisotropy field, $H_{K-eff:ms}$, be defined as $$\frac{H_{K-eff:ms}(M_{s_1} T_1 + M_{s_2} T_2)}{2} = R_{2\theta},$$

for the current situation of stress being present in the two strata due to lattice constant and thermal mismatches between each of the strata, and similar mismatches between them and any substrate on which they are supported and any structure which they in turn support. The resulting expression for the effective anisotropy field in the presence of magnetostriction by substituting for $R_{2\theta}$ from above is then $$H_{K-eff:ms} = \frac{2}{M_{s_1}T_1 + M_{s_2}T_2}\{[T_1K_1 + T_2K_2\cos(2\gamma)]^2 + 2[T_1K_1 + T_2K_2\cos(2\gamma)](a_1T_1\lambda_1\sigma_1 + a_2T_2\lambda_2\sigma_2)\cos(2\zeta) + [T_2K_2\sin(2\gamma)]^2 + 2T_2K_2\sin(2\gamma)(a_1T_1\lambda_1\sigma_1 + a_2T_2\lambda_2\sigma_2)\sin(2\zeta) + (a_1T_1\lambda_1\sigma_1 + a_2T_2\lambda_2\sigma_2)^2\}^{\frac{1}{2}}$$

This effective anisotropy field must not change significantly in the presence of stress to if repeatable performance in a stable device incorporating such a composite layer is to result. Thus, the derivative of the anisotropy field with respect to a strata stress should be zero for this result to obtain, or $$d\frac{H_{K-eff:ms}}{d\sigma_1} = \frac{1}{R_{2\theta}(M_{s_1}T_1 + M_{s_2}T_2)}[2(T_1K_1 + T_2K_2\cos(2\gamma))a_1T_1\lambda_1\cos(2\zeta) + 2T_2K_2\sin(2\gamma)\sin(2\zeta)a_1T_1\lambda_1 + 2(a_1T_1\lambda_1\sigma_1 + a_2T_2\lambda_2\sigma_2)a_1T_1\lambda_1] \doteq 0,$$

where the definition of $R_{2\theta}$ given above has again been used. The terms can be rearranged using $H_{K_1}=2K_1/M_{s_1}$ and $H_{K_2}=2K_2/M_{s_2}$ to give $$2(\alpha_1T_1\lambda_1\sigma_1)+\cos(2\zeta)T_1H_{K_1}M_{s_1}=-[\cos(2\zeta)T_2H_{K_2}M_{s_2}\cos(2\gamma)+T_2H_{K_2}M_{s_2}\sin(2\gamma)\sin(2\zeta)+2(\alpha_2T_2\lambda_2\sigma_2)].$$

Assuming, as above, that there is no skew between the easy axes of the two strata forming the composite layer because of them each being deposited in the same magnetic field, a simpler result is obtained as $$2(\alpha_1T_1\lambda_1\sigma_1)+\cos(2\zeta)T_1H_{K_1}M_{s_1}=-[\cos(2\zeta)T_2H_{K_2}M_{s_2}+2(\alpha_2T_2\lambda_2\sigma_2)]$$

Figure 2:
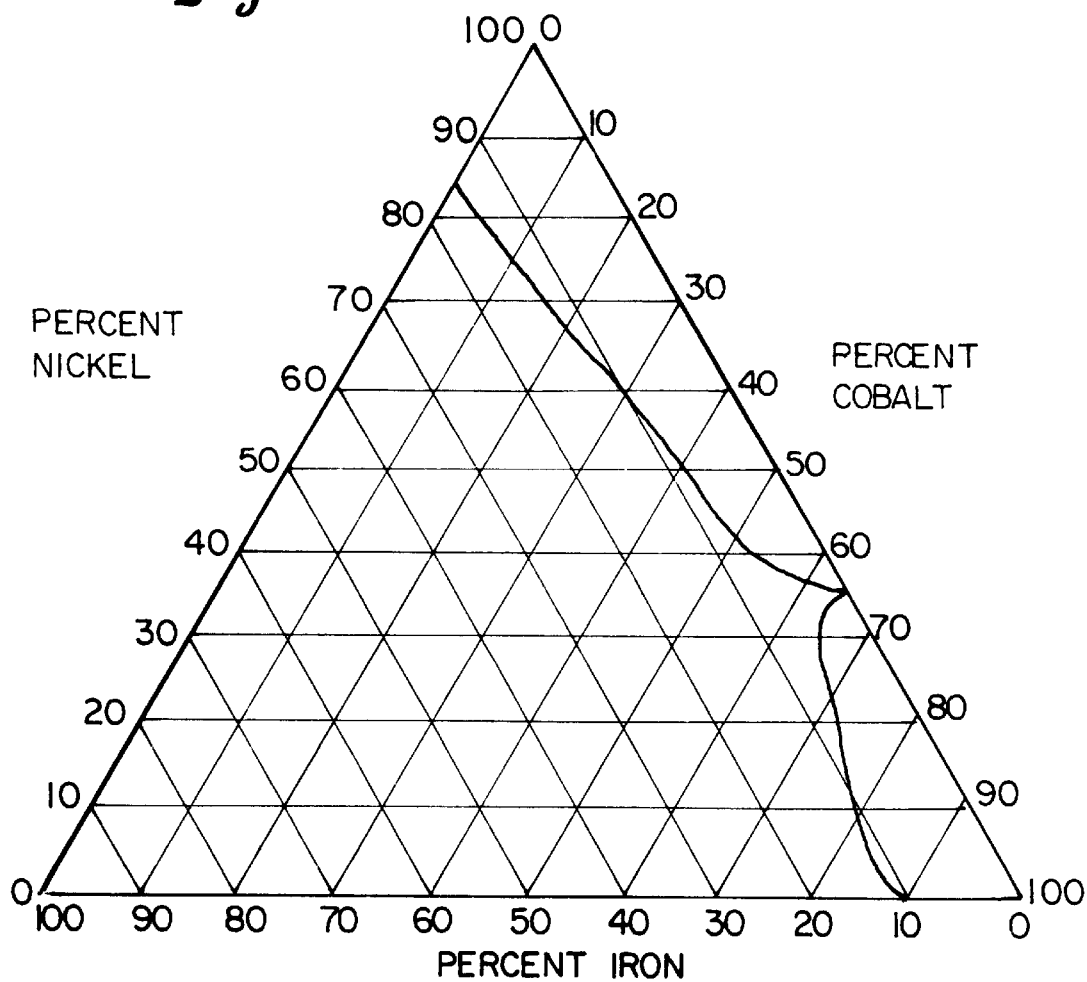
FIG. 2 is a composition diagram showing values of a parameter for selected compositions.

As can be seen from these last two equations, one side of the equation is the negative of the other for the condition of no change in the effective anisotropy field in the presence of stress to hold. Since the parameters in these equations, other than the magnetostriction constants, are positive or not entirely within the fabricator's control, metals system compositions chosen for one strata will be chosen to have a positive magnetostriction constant and the composition for the other strata will be chosen to have a negative magnetostriction constant to thereby permit satisfying these equations. That is, for the metal systems shown in FIGS. 2 and 3, the compositions must be on opposite sides of the zero magnetostriction composition line given in FIG. 2. Further adjustments to result in the composite layer being substantially independent of internal stress can be made by adjusting the thicknesses of the two strata therein.

Figure 1:
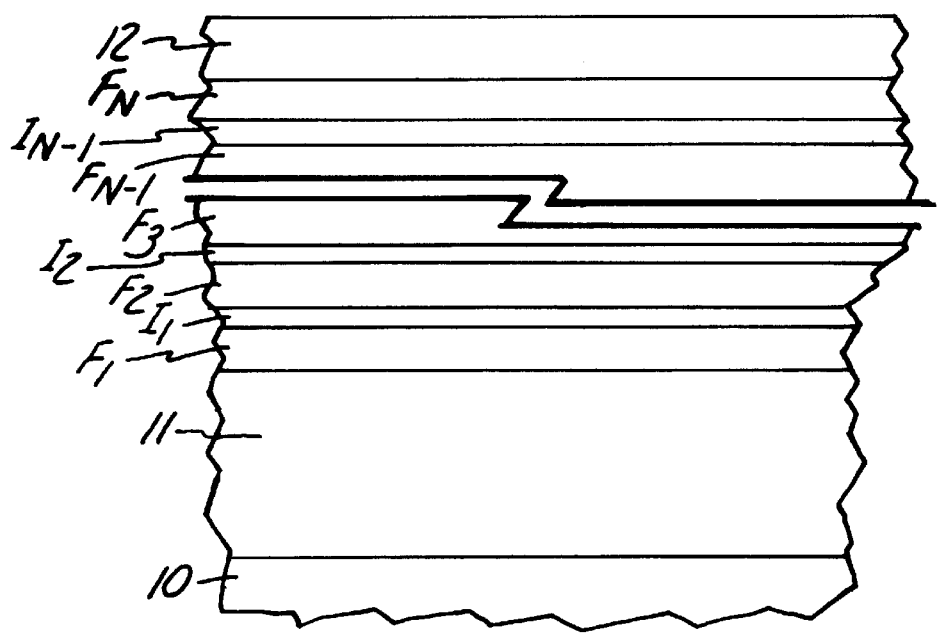
FIG. 1 is a diagrammatic representation of a portion of a device known in the prior art.
Figure 4:
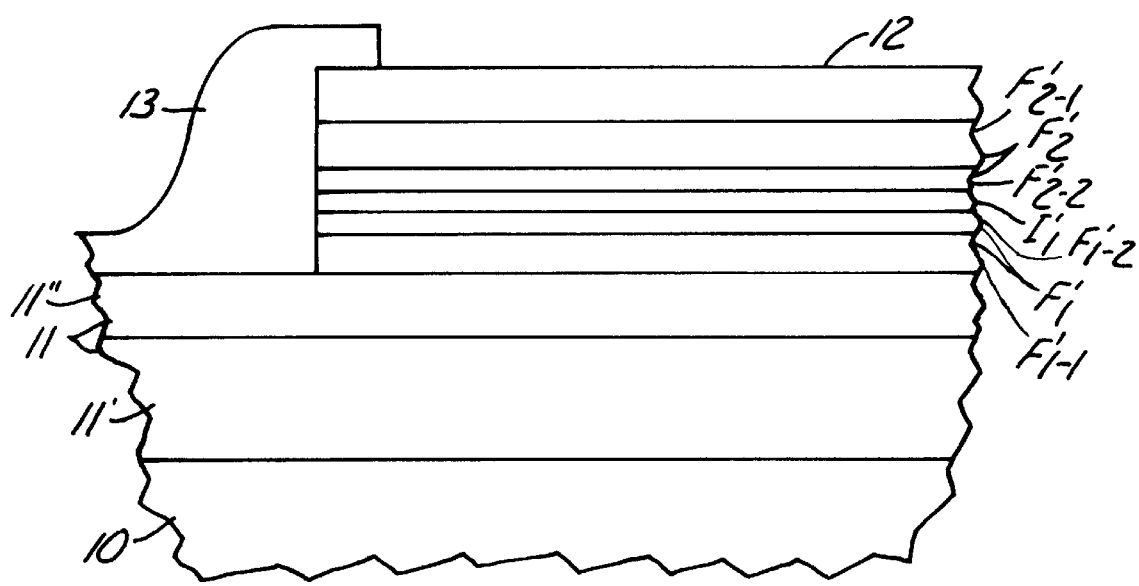
FIG. 4 is a diagrammatic representation of a portion of a device embodying the present invention.

Hence, those electronic devices, either memory or sensing devices, in which there is desired pairs of magnetic layers exhibiting an enhanced giant magnetoresistive effect, can be made from such composite layers. Such a memory or sensor device is shown in diagrammatic form in a cross-sectional view in FIG. 4 as a portion of a superlattice device formed in the monolithic integrated circuit chip, or on a ceramic substrate, or on other suitable material. Here, a "sandwich" structure, having just two ferromagnetic thin-films with general designations $F'_1$ and $F'_2$ separated by an intermediate layer $I'_I$, is shown as an abbreviated superlattice device. However, additional alternating layer pairs of intermediate layers and ferromagnetic thin-films could be provided in a larger superlattice structure to increase the giant magnetoresistive effect in the same manner as is shown in FIG. 1. FIG. 4 is not to scale, and is not in proportion, for purposes of clarity, which is also true of FIG. 1.

The integrated circuit chip, or other substrate, has again semiconductor material or other suitable material for substrate 10 which, in the situation of semiconductor material on an integrated circuit chip, has therein electronic integrated circuits provided for operating the abbreviated superlattice structure device thereon. Such a device could be intended for use in a memory cell in a digital memory or as a magnetic sensor, for instance. An electrically insulating layer again designated 11 is once more provided on substrate 10, the upper surface of layer 11 in the device portion shown supporting the abbreviated superlattice structure indicated above. Insulating layer 11 is shown as two separate layers, a lower layer, 11', formed of silicone dioxide perhaps 2,000 to 6,000 Å thick, and an upper layer, 11", formed of silicone nitride having typical thickness of 100 to 1,000 Å. Layers 11' and 11" are typically provided in a well-known sputter deposition step. Use of nitride layer 11" prevents oxygen atoms from fusing into the layer to be provided thereon which could chemically attack that layer.

The silicone nitride in layer 11" provides an amorphous insulator, that is, an insulator without any periodic structure typical of crystallinity, or, in other words, no long range atomic or molecular order. Alternatively, layer 11" can be formed of a material which has the same form in the same crystallinity class that the next succeeding layer has to provide a possibly better match between these two materials. Since a permalloy material will be used in the succeeding layer in a face-centered cubic structure, an alternative material would be magnesium oxide which also has a cubic structure and a compatible lattice constant.

The next process in forming the structure of FIG. 4 is the sputter deposition of 60 Å of permalloy material comprising 90% nickel and 10% iron to give a linear magnetostriction constant of about $-13 \times 10^{-6}$. The deposition occurs in the presence of an external magnetic field in the plane of the film oriented along a perpendicular to the view in that figure which, as just indicated, results in the film having a face-centered cubic structure. This fabrication field will leave the easy axis directed along the perpendicular to the view in FIG. 4 followed by this film, and the resulting film will have a magnetic moment typically about 8,000 Gauss. This is designated in FIG. 4 as component $F'_{1-1}$ of film $F'_1$, and is the first stratum in two-strata first ferromagnetic thin-film $F'_1$.

A second stratum, $F'_{1-2}$, is provided in a sputter deposition step, again performed in the presence of a similar fabrication magnetic field, as a material formed from 50% iron and 50% nickel to a thickness of 15 Å to get the full giant magnetoresistive effect. The magnetic moment of this material is 16,000 Gauss, a value higher than that of the magnetic moment of first stratum $F'_{1-1}$ in first ferromagnetic thin-film $F'_1$.

Thus, a higher magnetization moment, or higher magnetic saturation, material is provided in the positive ferromagnetic film to give a larger giant magnetoresistive response, and a softer magnetic material is used in the initial stratum to permit switching the magnetization reasonably in the composite layer. Yet, these two strata in the composite layer approximately compensate one another for magnetostriction so as not to have a resulting composite layer which would significantly disturb the anisotropy field over temperature changes leading to stress changes, or worse, mechanical failure of the device. Next, an intermediate layer, $I'_1$, is provided in the manner described in the patent application incorporated above having Ser. No. 07/976,905. Alternatively, a copper layer of less than 20 Å thickness can be provided by some other method if the result has a sufficiently low pinhole density.

The provision of intermediate layer $I'_1$ is followed by providing a second two-strata ferromagnetic thin-film, $F'_2$. A lower stratum for this film, $F'_{2-2}$, is deposited in the same manner as, with the result thereof being substantially the same as, upper stratum $F'_{1-2}$ of first ferromagnetic thin-film $F'_1$. Similarly, an upper stratum, $F'_{2-1}$ of second ferromagnetic thin-film $F'_2$ is deposited in the same manner as, with the result thereof being substantially the same as, lower stratum $F'_{1-1}$ of first ferromagnetic film $F'_1$. Finally, a tantalum nitride layer, 12, is provided on second ferromagnetic film $F'_2$ as a passivation and protection layer. After completion of passivation layer 12, ion milling is used to form the desired shape of the abbreviated superlattice structure in the form of a strip supported on layer 11". A tantalum interconnection, 13, is shown formed across the end of the abbreviated super lattice structure and onto the upper surface of layer 12. Composite layer $F'_2$ again is compensated for magnetostriction so as so prevent changing stress, such as that due to changing temperature, from significantly affecting the effective anisotropy field therein or the mechanical integrity thereof.

Figure 5:
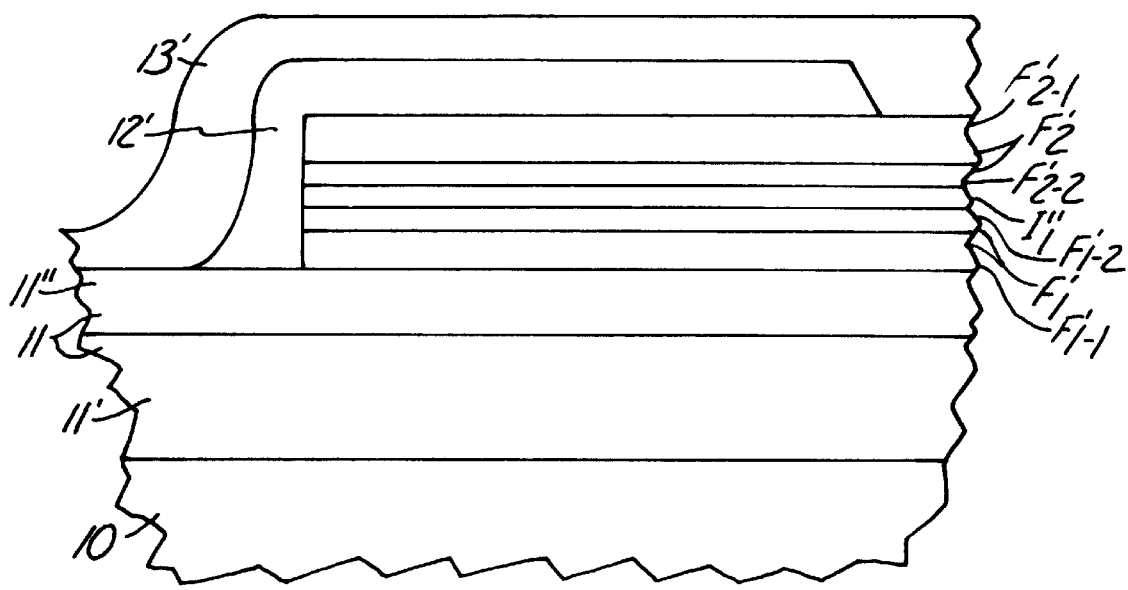
FIG. 5 is a diagrammatic representation of a portion of an alternative device embodying the present invention.

Alternatively, a magnetic diode can be constructed using such composite layers. Such a device is shown in FIG. 5. The same sort of substrate can be used for this device as was used for the previous memory device.

The first process in forming the structure of FIG. 5 after preparing the substrate is the sputter deposition of about 150 Å of permalloy material comprising 90% nickel and 10% iron to give a linear magnetostriction constant of about $-13 \times 10^{-6}$. The deposition occurs in the presence of an external magnetic field in the plane of the film oriented along a perpendicular to the view in that figure which, as just indicated, results in the film having a face-centered cubic structure. This fabrication field will leave the easy axis directed along the perpendicular to the view in FIG. 5 followed by this film, and the resulting film will have a magnetic moment typically about 8,000 Gauss. This is designated in FIG. 5 as component $F'_{1-1}$ of film $F'_1$, and is the first stratum in two-strata first ferromagnetic thin-film $F'_1$.

A second stratum, $F'_{1-2}$, is provided in a sputter deposition step, again performed in the presence of a similar fabrication magnetic field, as a material formed from 60% iron and 40% cobalt to a thickness of 10 Å to get the full giant magnetoresistive effect. The magnetic moment of this material is 24,000 Gauss, a value significantly higher than that of the magnetic moment of first stratum $F'_{1-1}$ in first ferromagnetic thin-film $F'_1$.

Thus, a higher magnetization moment, or higher magnetic saturation, material is provided in the positive ferromagnetic film to give a larger giant magnetoresistive response, and a softer magnetic material is used in the initial stratum to permit switching the magnetization reasonably in the composite layer. Yet, these two strata in the composite layer approximately compensate one another for magnetostriction so as not to have a resulting composite layer which would significantly disturb the anisotropy field over temperature changes leading to stress changes, or worse, mechanical failure of the device.

Next, an intermediate layer, $I'_1$, of the electrically insulating material silicon nitride ($Si_3N_4$) is deposited by a well known method on second stratum $F'_{1-2}$ to a thickness of 15 Å. Again, this must be done in a manner to minimize pinholes in the resulting layer. Alternatively, magnesium oxide may be used.

The provision of intermediate layer $I'_1$ is followed by providing a second two-strata ferromagnetic thin-film, $F'_2$. A lower stratum for this film, $F'_{2-2}$, is deposited in the same manner as, with the result thereof being substantially the same as, upper stratum $F'_{1-2}$ of first ferromagnetic thin-film $F'_1$. Similarly, an upper stratum, $F'_{2-1}$ of second ferromagnetic thin-film $F'_2$ is deposited in the same manner as, with the result thereof being substantially the same as, lower stratum $F'_{1-1}$ of first ferromagnetic film $F'_1$. Finally, a tantalum nitride layer, 12, is provided on second ferromagnetic film $F'_2$ as a passivation and protection layer. After completion of passivation layer 12, ion milling is used to form the desired shape of the abbreviated super lattice structure in the form of a strip supported on layer 11". A tantalum interconnection, 13, is shown formed across the end of the abbreviated super lattice structure and onto the upper surface of layer 12. Composite layer $F'_2$ again is compensated for magnetostriction so as so prevent changing stress, such as that due to changing temperature, from significantly affecting the effective anisotropy field therein or the mechanical integrity thereof.

Although the present invention has been described with reference to preferred embodiments, workers skilled in the art will recognize that changes may be made in form and detail without departing from the spirit and scope of the invention.

What is claimed is:

1. A magnetoresistive thin-film layered structure, said structure comprising:

a substrate having a major surface portion;

a magnetostrictive, magnetoresistive, anisotropic first ferromagnetic thin-film provided on said substrate major surface;

a magnetostrictive, magnetoresistive, anisotropic second ferromagnetic thin-film provided on said first ferromagnetic thin-film with a magnetic moment differing therefrom to form a first composite thin-film therewith, said first composite thin-film being substantially free of magnetostriction;

an intermediate layer provided on said second ferromagnetic thin-film with a thickness of less than 50 Å;

a magnetostrictive, magnetoresistive, anisotropic third ferromagnetic thin-film provided on said intermediate layer; and a magnetostrictive, magnetoresistive, anisotropic fourth ferromagnetic thin-film provided on said third ferromagnetic thin-film with a magnetic moment differing therefrom to form a second composite thin-film therewith, said second composite thin-film being substantially free of magnetostriction.

2. The structure of claim 1 wherein said substrate major surface portion is electrically insulative.

3. The structure of claim 1 wherein said first composite thin-film has a thickness of less than 100 Å.

4. The structure of claim 1 wherein said second ferromagnetic thin-film has a composition differing from that of said first ferromagnetic thin-film.

5. The structure of claim 2 wherein said substrate is an amorphous material at said major surface portion thereof.

6. The structure of claim 2 wherein said substrate is a crystalline material at said major surface portion thereof.

7. The structure of claim 3 wherein said second ferromagnetic thin-film has a thickness of less than 25 Å.

8. The structure of claim 4 wherein said first ferromagnetic thin-film comprises a mixture of iron and nickel, and wherein said second ferromagnetic thin-film comprises a mixture of cobalt and iron.

9. The structure of claim 4 wherein said first ferromagnetic thin-film comprises a mixture of iron and nickel, and wherein said second ferromagnetic thin-film also comprises a mixture of iron and nickel but in proportions differing from that in said first ferromagnetic thin-film.

10. The structure of claim 4 wherein said first ferromagnetic thin-film has a particular form in a crystal lattice class, and wherein said second ferromagnetic thin-film has that same form in that same crystal lattice class as does said first ferromagnetic thin-film.

11. The structure of claim 4 wherein said first ferromagnetic thin-film has a thickness differing from that of said second ferromagnetic thin-film.

12. The structure of claim 4 wherein said second ferromagnetic thin-film has a magnetic moment greater than that of said first ferromagnetic thin-film.

13. The structure of claim 1 wherein said intermediate layer has a thickness of less than 30 Å.

14. The structure of claim 1 wherein said intermediate layer has substantially that same form in that same crystal lattice class as does said second ferromagnetic thin-film.

15. The structure of claim 1 wherein said intermediate layer is formed of a substantially non-magnetic, conductive alloy.

16. The structure of claim 1 wherein said intermediate layer is formed of an electrically insulative material.

17. The structure of claim 1 wherein said second composite thin-film has a thickness of less than 100 Å.

18. The structure of claim 1 wherein said third ferromagnetic thin-film has a composition differing from that of said fourth ferromagnetic thin-film.

19. The structure of claim 17 wherein said third ferromagnetic thin-film has a thickness of less than 25 Å.

20. The structure of claim 18 wherein said fourth ferromagnetic thin-film comprises a mixture of iron and nickel, and wherein said third ferromagnetic thin-film comprises a mixture of cobalt and iron.

21. The structure of claim 18 wherein said fourth ferromagnetic thin-film comprises a mixture of iron and nickel, and wherein said third ferromagnetic thin-film also comprises a mixture of iron and nickel but in proportions differing from that in said fourth ferromagnetic thin-film.

22. The structure of claim 18 wherein said third ferromagnetic thin-film has a particular form in a crystal lattice class, and wherein said fourth ferromagnetic thin-film has that same form in that same crystal lattice class as does said third ferromagnetic thin-film.

23. The structure of claim 18 wherein said third ferromagnetic thin-film has a thickness differing from that of said fourth ferromagnetic thin-film.

24. The structure of claim 18 wherein said third ferromagnetic thin-film has a magnetic moment greater than that of said fourth ferromagnetic thin-film.

25. A magnetoresistive thin-film layered structure, said structure comprising:

a substrate having a major surface portion;

a magnetoresistive, anisotropic first ferromagnetic thin-film provided on said substrate major surface;

a magnetoresistive, anisotropic second ferromagnetic thin-film provided on said first ferromagnetic thin-film with a magnetic moment differing therefrom to form a first composite thin-film therewith, said first composite thin-film being substantially free of magnetostriction;

an electrically insulative intermediate layer provided on said second ferromagnetic thin-film with a thickness of less than 50 Å;

a magnetoresistive, anisotropic third ferromagnetic thin-film provided on said intermediate layer;

a magnetoresistive, anisotropic fourth ferromagnetic thin-film provided on said third ferromagnetic thin-film to form a second composite thin-film therewith, said second composite thin-film being substantially free of magnetostriction.

26. The structure of claim 25 wherein said fourth ferromagnetic thin-film has a magnetic moment differing from that of said third ferromagnetic thin-film.

* * * * *

UNITED STATES PATENT AND TRADEMARK OFFICE
CERTIFICATE OF CORRECTION

PATENT NO. : 6,168,860 B1
DATED : January 2, 2001
INVENTOR(S) : James M. Daughton It is certified that error appears in the above-identified patent and that said Letters Patent is hereby corrected as shown below:

Column 2,
Line 54, delete "filns", insert -- films --

Column 5,
Line 21, before "be", insert -- can --
Line 24, delete "mM", insert -- mN --

Column 8,
Line 6, delete "in"

Column 11,
Line 62, delete "$\alpha_1$", insert -- $a_1$ --
Line 62, delete "$\lambda_{1\sigma 1}$", insert -- $\lambda_1 \sigma_1$ --
Line 62, delete "$^+\alpha_1$", insert -- $^-a_1$ --
Line 62, delete "$\alpha_2$", insert -- $a_2$ --

Column 12,
Line 50, delete "$(a_2 T_2 \lambda_2 \sigma_2)$", insert -- $(a_2 T_2 \lambda_2 \sigma_2)$ --
Line 50, delete "$\})^{\frac{1}{2}}$", insert -- $\}^{\frac{1}{2}}$ --

UNITED STATES PATENT AND TRADEMARK OFFICE
CERTIFICATE OF CORRECTION

PATENT NO. : 6,168,860 B1
DATED : January 2, 2001
INVENTOR(S) : James M. Daughton It is certified that error appears in the above-identified patent and that said Letters Patent is hereby corrected as shown below:

<u>Column 13,</u>
Line 34, delete "*to give*", and insert -- to give --
Line 35, delete "$\alpha_2$", insert -- $a_2$ --
Line 36, delete "$\alpha_1$", insert -- $a_1$ --
Line 37, delete "$\alpha_2$", insert -- $a_2$ --
Line 44, delete "$\alpha_1$", insert -- $a_1$ --

Signed and Sealed this

Thirteenth Day of August, 2002

*Attest:*

*Attesting Officer*

JAMES E. ROGAN
*Director of the United States Patent and Trademark Office*